US012783027B2

(12) United States Patent
Chen et al.

(10) Patent No.: US 12,783,027 B2
(45) Date of Patent: Nov. 3, 2026

(54) HEAT SINK ASSEMBLY FOR DUAL IN-LINE MEMORY MODULES

(71) Applicant: Super Micro Computer, Inc., San Jose, CA (US)

(72) Inventors: Chun Hao Chen, San Jose, CA (US); Ruei-Fu Weng, San Jose, CA (US)

(73) Assignee: Super Micro Computer, Inc., San Jose, CA (US)

( * ) Notice: Subject to any disclaimer, the term of this patent is extended or adjusted under 35 U.S.C. 154(b) by 239 days.

(21) Appl. No.: 18/774,120

(22) Filed: Jul. 16, 2024

(65) Prior Publication Data

US 2026/0023416 A1 Jan. 22, 2026

(51) Int. Cl.

*G06F 1/20* (2006.01)
*H05K 7/20* (2006.01)

(52) U.S. Cl.

CPC ........... *G06F 1/20* (2013.01); *H05K 7/20254* (2013.01); *H05K 7/20272* (2013.01); *H05K 7/2049* (2013.01); *H05K 7/20509* (2013.01); *G06F 2200/201* (2013.01)

(58) Field of Classification Search

CPC ........... H05K 7/20509; H05K 7/20254; H05K 7/20263; H05K 7/20336; H05K 7/20409; H05K 1/181; H05K 13/00; H05K 7/1405; H05K 7/20154; H05K 7/2039; H05K 7/20272; H05K 7/20445; H05K 2201/10159; H05K 7/2049; G06F 1/20; G06F 2200/201; G06F 1/206; H10W 90/724; F28D 15/0275; F28D 2021/0031; F28F 13/00; F28F 27/02; F28F 3/04; B23P 2700/10; B25B 27/02

See application file for complete search history.

(56) References Cited

U.S. PATENT DOCUMENTS

| | | | | |
|---|---|---|---|---|
| 7,450,385 B1 * | 11/2008 | Campbell | .......... | H05K 7/20781 361/689 |
| 8,564,951 B1 * | 10/2013 | Watanabe | ................. | G06F 1/20 165/185 |
| 8,570,744 B2 * | 10/2013 | Rau | ........................... | G06F 1/20 361/720 |
| 8,625,280 B2 * | 1/2014 | Rau | ........................... | G06F 1/20 361/699 |
| 8,767,403 B2 * | 7/2014 | Rau | ....................... | H10W 40/47 361/721 |
| 9,298,231 B2 * | 3/2016 | Arvelo | .................... | F16L 41/10 |
| 10,568,229 B1 * | 2/2020 | Ng | ........................... | H05K 5/03 |
| 10,582,645 B1 * | 3/2020 | Kufahl | ............... | H05K 7/20772 |
| 10,602,640 B1 * | 3/2020 | Tsai | ................... | H05K 7/20254 |
| 11,246,236 B2 * | 2/2022 | Urai | ................... | H05K 7/20272 |

(Continued)

OTHER PUBLICATIONS

Rau et al., Cooling Memory Modules Using Wedge-Shaped Heat Spreaders, May 5, 2011, PE2E Translation (Year: 2011).*

(Continued)

*Primary Examiner* — Michael A Matey
(74) *Attorney, Agent, or Firm* — Beyer Law Group LLP

(57) ABSTRACT

Disclosed is a heat sink assembly for dual in-line memory modules (DIMMs). The heat sink assembly includes side plates and a heat sink of an electronic device. The side plates clamp the DIMMs. Heat from the DIMMs is conducted to the heat sink of the electronic device, which is cooled by a liquid coolant.

15 Claims, 8 Drawing Sheets

(56) References Cited

U.S. PATENT DOCUMENTS

| | | | | |
|---|---|---|---|---|
| 11,523,542 | B2 * | 12/2022 | Gaskill | H05K 1/021 |
| 2008/0084668 | A1 * | 4/2008 | Campbell | H05K 7/20509 257/E23.098 |
| 2008/0092387 | A1 * | 4/2008 | Campbell | H05K 7/20772 29/890.035 |
| 2009/0238235 | A1 * | 9/2009 | Campbell | H05K 7/20836 250/339.04 |
| 2009/0277616 | A1 * | 11/2009 | Cipolla | F28D 15/0233 165/104.33 |
| 2010/0313590 | A1 * | 12/2010 | Campbell | H05K 7/20809 29/890.035 |
| 2011/0056674 | A1 * | 3/2011 | Campbell | H05K 7/2079 165/104.31 |
| 2011/0060470 | A1 * | 3/2011 | Campbell | G05D 23/1934 700/282 |
| 2011/0286175 | A1 * | 11/2011 | Iyengar | G06F 1/20 361/679.47 |
| 2012/0281358 | A1 * | 11/2012 | Chainer | H05K 7/20781 361/699 |
| 2013/0021746 | A1 * | 1/2013 | Campbell | H05K 7/20827 165/104.13 |
| 2013/0194745 | A1 * | 8/2013 | Meijer | G06F 1/20 361/679.47 |
| 2014/0049918 | A1 * | 2/2014 | Chainer | H05K 7/20836 361/702 |
| 2014/0202678 | A1 * | 7/2014 | Goth | H05K 7/20763 165/200 |
| 2015/0109729 | A1 * | 4/2015 | Campbell | H05K 7/20772 361/679.47 |
| 2015/0109735 | A1 * | 4/2015 | Campbell | H05K 7/2079 361/700 |
| 2016/0061364 | A1 * | 3/2016 | Brunschwiler | F16L 37/138 285/308 |
| 2016/0113150 | A1 * | 4/2016 | Krug, Jr. | H05K 7/20781 165/104.31 |
| 2016/0227668 | A1 * | 8/2016 | Wang | H05K 7/20727 |
| 2018/0004259 | A1 * | 1/2018 | Kulkarni | F25B 21/02 |
| 2018/0027696 | A1 * | 1/2018 | Franz | H05K 7/20772 361/679.47 |
| 2019/0045663 | A1 * | 2/2019 | Shia | F28D 15/0241 |
| 2020/0288597 | A1 * | 9/2020 | Shen | H05K 7/20727 |
| 2020/0305311 | A1 * | 9/2020 | Dallaserra | G06F 1/20 |
| 2020/0344918 | A1 * | 10/2020 | Wondimu | H05K 7/20772 |
| 2021/0204437 | A1 * | 7/2021 | Liang | H05K 1/181 |
| 2021/0321528 | A1 * | 10/2021 | Curtis | H05K 7/2039 |
| 2022/0003511 | A1 * | 1/2022 | Embleton | F28F 21/02 |
| 2022/0124942 | A1 * | 4/2022 | Tan | H05K 7/20272 |
| 2022/0225542 | A1 * | 7/2022 | Subrahmanyam | H05K 1/0203 |
| 2022/0369513 | A1 * | 11/2022 | Franz | G06F 1/206 |
| 2022/0408593 | A1 * | 12/2022 | Chen | H05K 7/20272 |
| 2023/0232582 | A1 * | 7/2023 | Liu | H05K 7/203 361/679.53 |
| 2024/0008220 | A1 * | 1/2024 | Kadhim | H05K 7/20272 |
| 2024/0237296 | A1 * | 7/2024 | Chen | H05K 7/20636 |
| 2025/0324546 | A1 * | 10/2025 | Ahuja | G06F 1/20 |
| 2026/0025956 | A1 * | 1/2026 | Tien | G06F 1/20 |
| 2026/0190284 | A1 * | 7/2026 | Ganga | H05K 7/20254 |

OTHER PUBLICATIONS

"Heat Sink", Wikipedia, https://en.wikipedia.org/wiki/Heat_sink, Downloaded Jun. 14, 2024.

"DIMM", Wikipedia, https://en.wikipedia.org/wiki/DIMM, Downloaded Jul. 2, 2024.

"Computer Cooling", Wikipedia, https://en.wikipedia.org/wiki/Computer_cooling, Downloaded Jul. 2, 2024.

* cited by examiner

HEAT SINK ASSEMBLY FOR DUAL IN-LINE MEMORY MODULES

TECHNICAL FIELD

The present disclosure is directed to heat sinks of electronic devices.

BACKGROUND

A heat sink is a passive heat exchanger that transfers the heat generated by an electronic device to a fluid medium, often air or a liquid coolant, where the heat is dissipated away from the electronic device, thereby allowing regulation of the electronic device's temperature. For example, heat sinks are widely used to dissipate heat from central processing units (CPUs), graphics processing units (GPUs), and other high heat generating electronic devices. A thermal interface material (TIM), such as a thermal pad, thermal grease, or thermal tape, may be used as a heat transfer medium between the electronic device and the heat sink. Recurring challenges in heat sink design include improving thermal efficiency and reducing the cost of the heat sink.

BRIEF SUMMARY

In one embodiment, a heat sink assembly comprises a plurality of side plates, a cold plate, and a transfer plate. The plurality of side plates supports a plurality of dual in-line memory modules (DIMMs), each of the plurality of DIMMs is clamped by a pair of side plates of the plurality of side plates. The cold plate comprises an inlet port and an outlet port that are connected to flow a liquid coolant through the cold plate, wherein heat is conducted from an electronic device to the cold plate. The transfer plate is attached to the cold plate and to the plurality of side plates to conduct heat from the plurality of DIMMs to the cold plate.

In another embodiment, a method of dissipating heat from a plurality of DIMMs includes clamping each of the plurality of DIMMs by a pair of side plates of a plurality of side plates. Heat is conducted from the plurality of DIMMs to a heat sink of an electronic device by way of the plurality of side plates. Heat is conducted from the electronic device to the heat sink. A liquid coolant is pumped through the heat sink and cooled.

In another embodiment, a heat sink assembly comprises a plurality of side plates that are tightened together, each side plate of the plurality of side plates comprising a sidewall, wherein each DIMM of a plurality of DIMMs is clamped by side walls of a pair of side plates of the plurality of side plates. A thermal interface material is disposed between sidewalls of the plurality of side plates and corresponding DIMMs of the plurality of DIMMs. The thermal interface material may be a thermal pad.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

In the present disclosure, numerous specific details are provided, such as examples of components, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
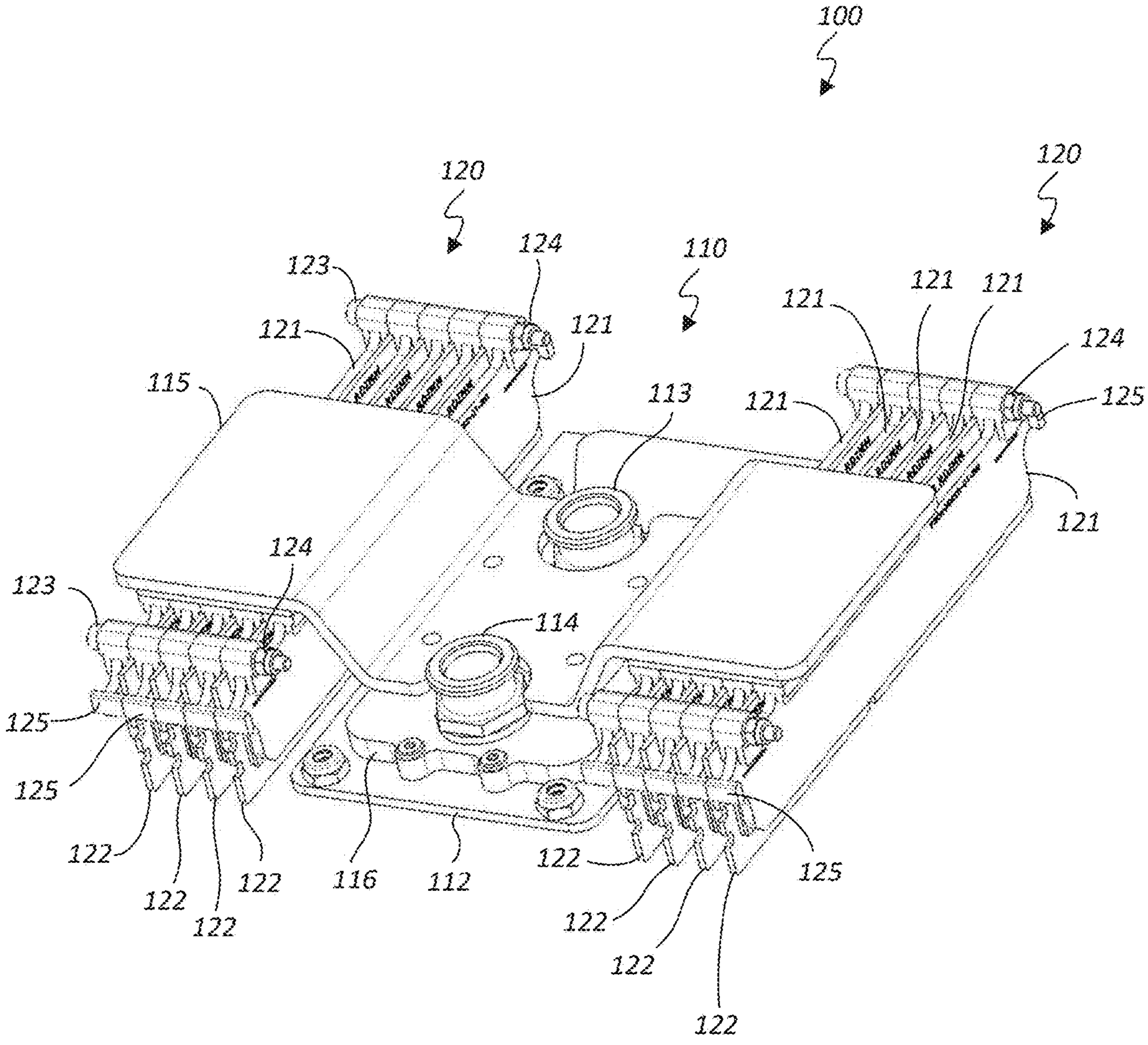
FIG. 1 shows a heat sink assembly, in accordance with an embodiment of the present invention.

FIG. 1 shows a heat sink assembly 100, in accordance with an embodiment of the present invention. The heat sink assembly 100 comprises a heat sink subassembly 120 and a heat sink subassembly 110.

The heat sink subassembly 110 comprises a base plate 112, a cold plate 116, and a transfer plate 115. The transfer plate 115 is attached to the cold plate 116, which in turn is attached to the base plate 112. The transfer plate 115, cold plate 116, and base plate 112 may be made of copper, aluminum, or other material with high thermal conductivity that is commonly-used for heat sinks.

The cold plate 116 includes ports 113 and 114 for flowing a liquid coolant through the cold plate 116. For example, the port 113 may be an inlet that receives the liquid coolant into the cold plate 116, and the port 114 may be an outlet through which the liquid coolant flows out of the cold plate 116. The cold plate 116 is attached to the base plate 112. The base plate 112 dissipates heat from an electronic device (not shown in FIG. 1), which in one embodiment is a central processing unit (CPU) or other integrated circuit (IC). A thermal interface material, such as thermal grease, thermal tape, thermal pad, etc., or other thermal transfer medium or component may be disposed between the base plate 112 and the CPU. Heat from the CPU is conducted to the cold plate 116, and is dissipated to the liquid coolant flowing through the cold plate 116.

The heat sink subassembly 120 comprises a plurality of side plates 121 that are joined together. Each pair of side plates 121 holds a dual in-line memory module (DIMM) 122. In the example of FIG. 1, each subassembly 120 has 5 side plates 121 to hold 4 DIMMs 122. More or fewer side plates 121 may be employed to hold a desired number of DIMMs 122. Each side plate 121 has a bar portion 125 on the front end and on the back end to secure the DIMMs 122, preventing the DIMMs 122 from moving laterally.

In one embodiment, the side plates 121 are identical. In other words, all of the side plates 121 are the same and are thus interchangeable. This allows the side plates 121 to be fabricated by die casting using the same mold, thereby saving manufacturing cost. The side plates 121 may also be reused. The side plates 121 may be made of copper, aluminum, or other material with high conductivity that is commonly used for heat sinks. The side plates 121 may be joined together as a single subassembly 120 by nuts and bolts or other fastener. In the example of FIG. 1, a long bolt 123 goes through holes of tab portions of the side plates 121 and is secured by a nut 124. A thermal pad (not shown in FIG. 1) or other suitable thermal interface material is placed between a side plate 121 and a DIMM 122, and the side plates 121 are tightened together to clamp the DIMM 122. The thermal pad conducts heat from memory devices and/or other electronic devices on the DIMM 122 to the side plates 121. Heat from the side plates 121 is conducted to the transfer plate 115, which conducts the heat to the cold plate 116, thereby achieving high thermal efficiency by taking advantage of the liquid cooling of the heat sink subassembly 110. A thermal pad or other thermal interface material may be disposed between a top surface of the side plates 121 and the transfer plate 115.

Figure 2:
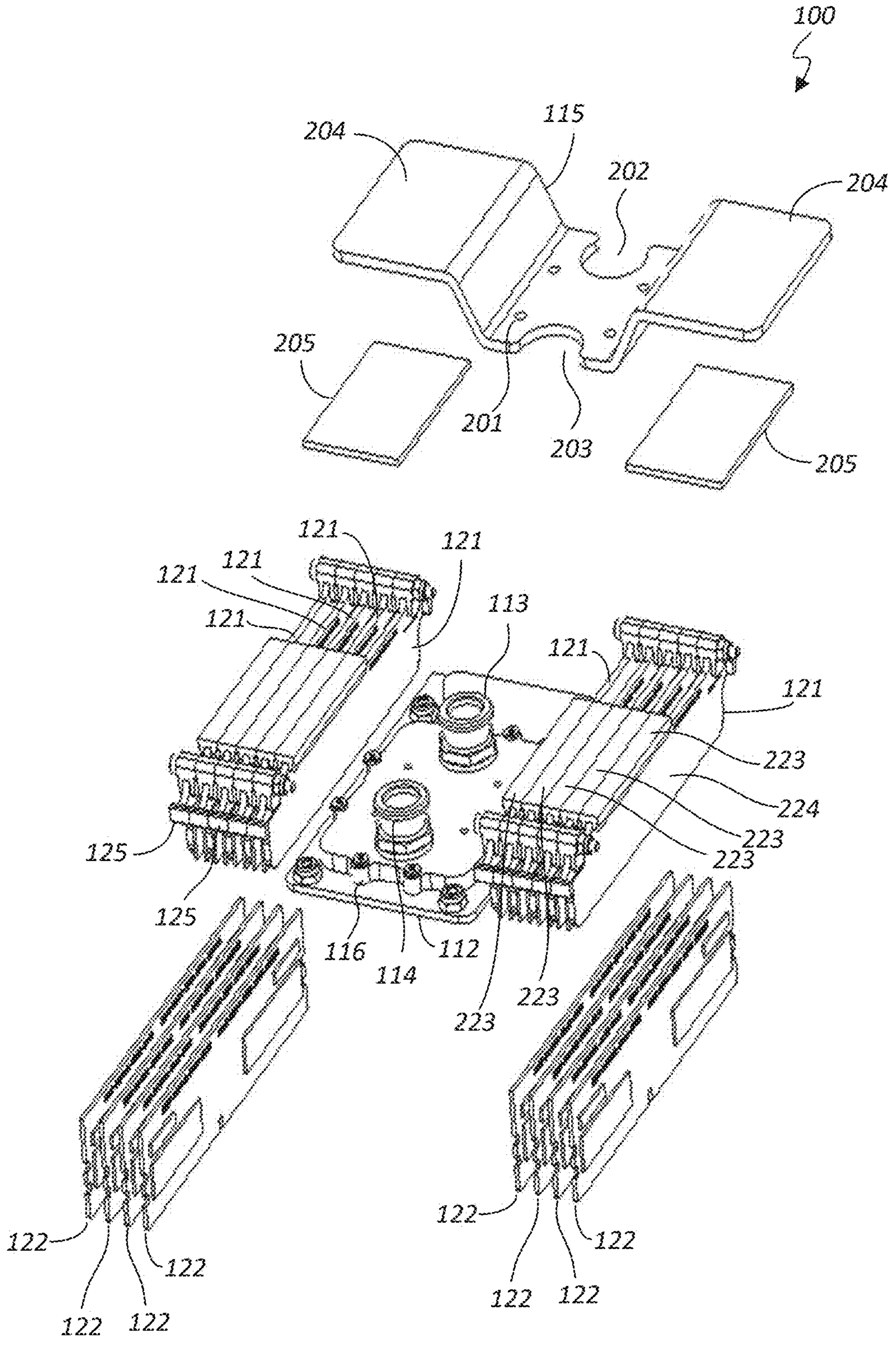
FIG. 2 shows an exploded view of the heat sink assembly of FIG. 1, in accordance with an embodiment of the present invention.

FIG. 2 shows an exploded view of the heat sink assembly 100, in accordance with an embodiment of the present invention. In the example of FIG. 2, the transfer plate 115 has a notch 202 that goes around the port 113 of the cold plate 116, and a notch 203 that goes around the port 114 of the cold plate 116. The notches 202 and 203 reduce the footprint of the transfer plate 115. The transfer plate 115 has a plurality of holes 201 through which screws or other fasteners go to attach the transfer plate 115 to the cold plate 116.

A side plate 121 has a side wall 224 one each side, and a top surface 223 on the top end. The top surfaces 223 of adjacent side plates 121 touch to form a continuous surface on which a thermal pad 205 may be attached. A wing portion 204 of the transfer plate 115 is attached to the thermal pad 205. A DIMM 122 is inserted between sidewalls 224 of a pair of side plates 121 and secured within the pair of side plates 121 by bar portions 125 on the front and back ends of the side plates 121. Tightening the fastener that holds the side plates 121 together clamps the DIMMs 122 between sidewalls 224.

Figure 3:
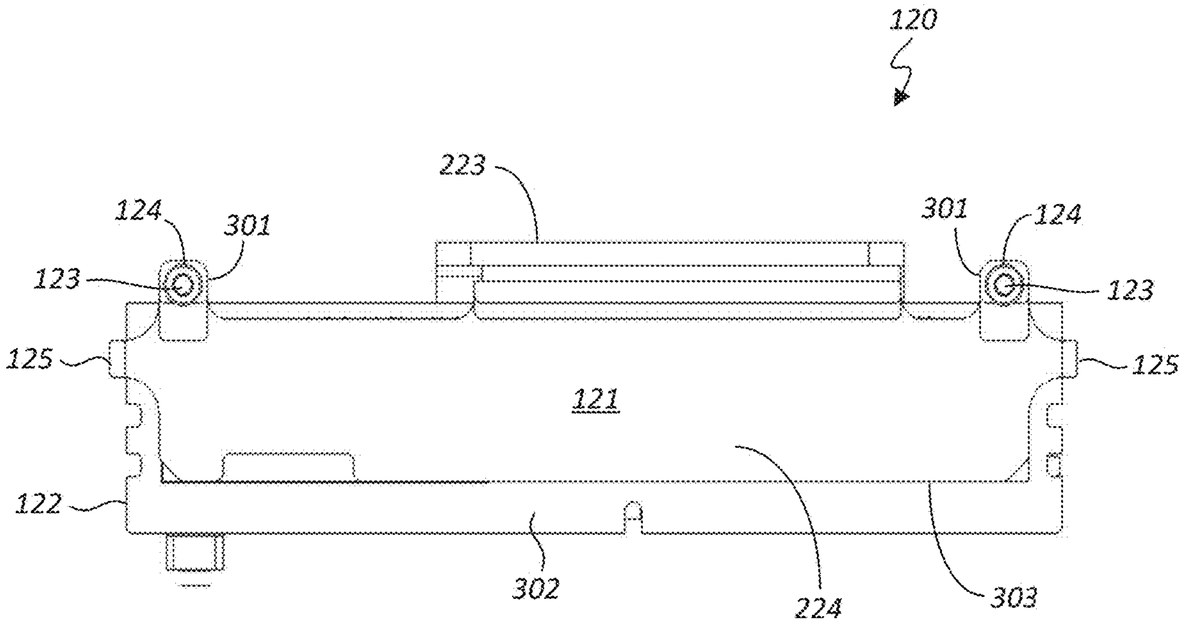
FIG. 3 shows a side view of a heat sink subassembly of FIG. 1 that has side plates, in accordance with an embodiment of the present invention.

FIG. 3 shows a side view of the heat sink subassembly 120, in accordance with an embodiment of the present invention. In the example of FIG. 3, a side plate 121 has a top surface 223 on the top end, a side wall 224 on both sides, tab portions 301 on the top end, and a bar portion 125 on the front and back ends. A tab portion 301 has a hole (not visible in FIG. 3) through which a long bolt 123 is inserted to join together a plurality of side plates 121. A DIMM 122 is clamped by a pair of adjacent side plates 121. A bar portion 125 on the front end and on the back end of the side plate 121 secures the DIMM 122 and prevents the DIMM 122 from moving laterally. A connector 302 of the DIMM 122 extends past a bottom end 303 of the side plate 121 to connect to a corresponding slot on a motherboard or other substrate.

Figure 4:
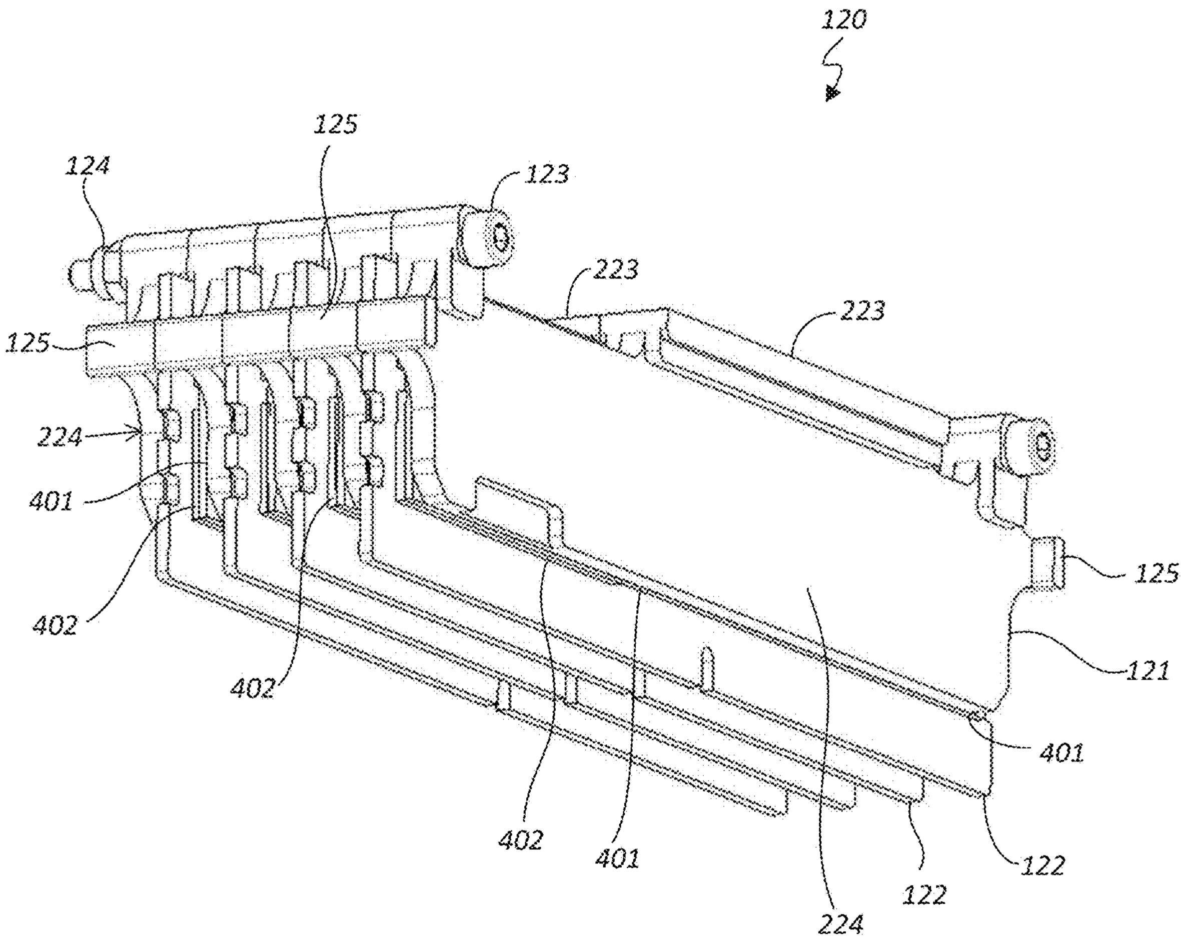
FIG. 4 shows another view of the heat sink subassembly of FIG. 1 that has side plates, in accordance with an embodiment of the present invention.

FIG. 4 shows another view of the heat sink subassembly 120, in accordance with an embodiment of the present invention.

As shown in FIG. 4, a thermal pad 401 is disposed between a DIMM 122 and the side plates 122 that are clamping the DIMM 122. The thermal pad 401 attaches to memory devices 402 and/or other electronic devices of the DIMM 122. The other labeled components shown in FIG. 4 are as described in previous figures.

Figure 5:
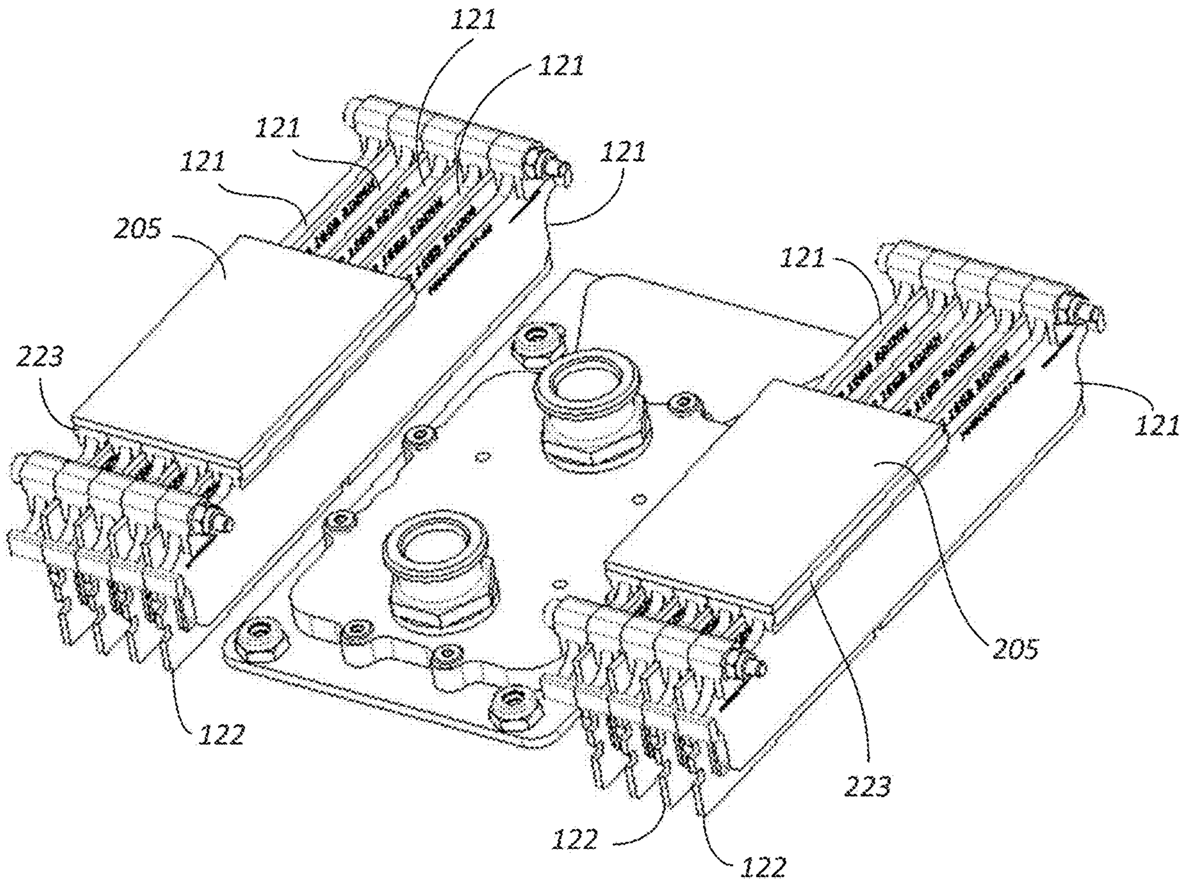
FIGS. 5 and 6 illustrate attaching a transfer plate to side plates, in accordance with an embodiment of the present invention.
Figure 6:
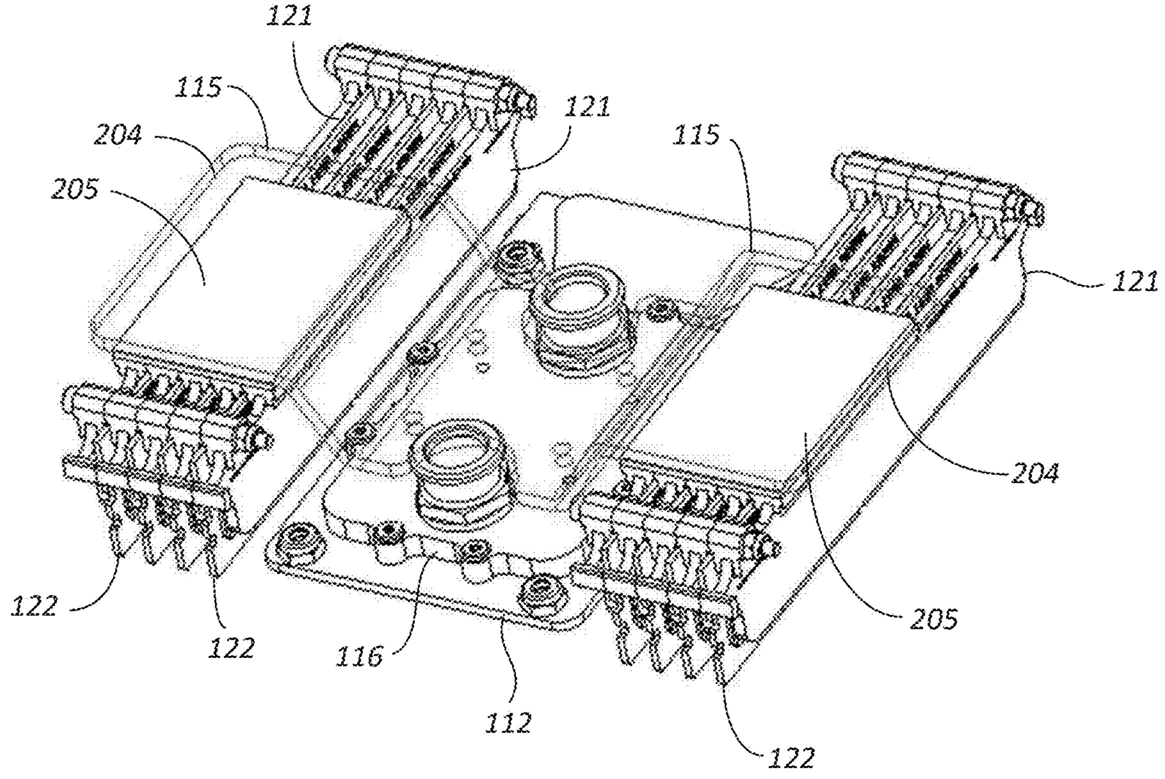

FIGS. 5 and 6 illustrate attaching the transfer plate 115 to the side plates 121, in accordance with an embodiment of the present invention.

FIG. 5 shows a thermal pad 205 (also shown in FIG. 2) attached to the top surfaces 223 of the side plates 121. FIG. 6 shows each wing portion 204 of the transfer plate 115, which is depicted as transparent for ease of illustration, attached to a corresponding thermal pad 205. The transfer plate 115 is attached to the cold plate 116, which is attached to the base plate 112.

Figure 7:
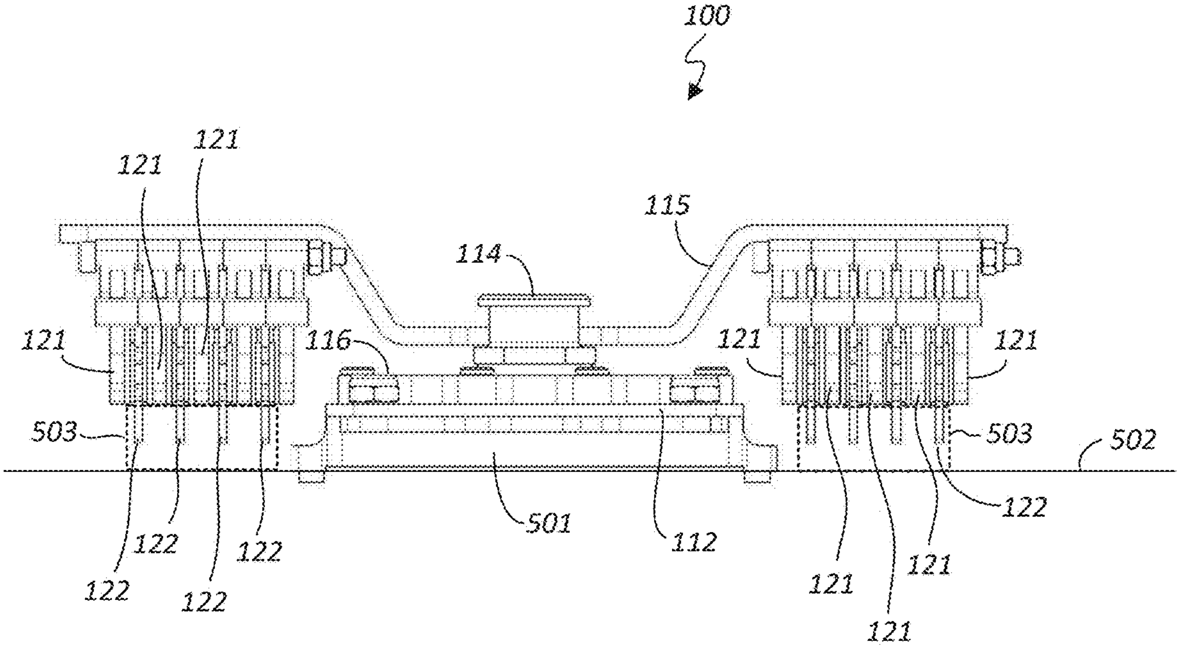
FIG. 7 shows a front view of the heat sink assembly of FIG. 1, in accordance with an embodiment of the present invention.

FIG. 7 shows a front view of the heat sink assembly 100, in accordance with an embodiment of the present invention.

In the example of FIG. 7, a CPU 501 (or other electronic device) is mounted on a motherboard 502, which may comprise a printed circuit board (PCB) or other substrate. The base plate 112 is attached to the CPU 501, and the cold plate 116 is attached to the base plate 112. A thermal interface material may be disposed between the CPU 501 and the base plate 112. A port 114 and a port 113 (not shown in FIG. 7) allow a liquid coolant to be flown through the cold plate 116. The transfer plate 115 is attached to the side plates 121, which clamp the DIMMs 122. Slots 503 on the motherboard 502 receive connectors of corresponding DIMMs 122.

Figure 8:
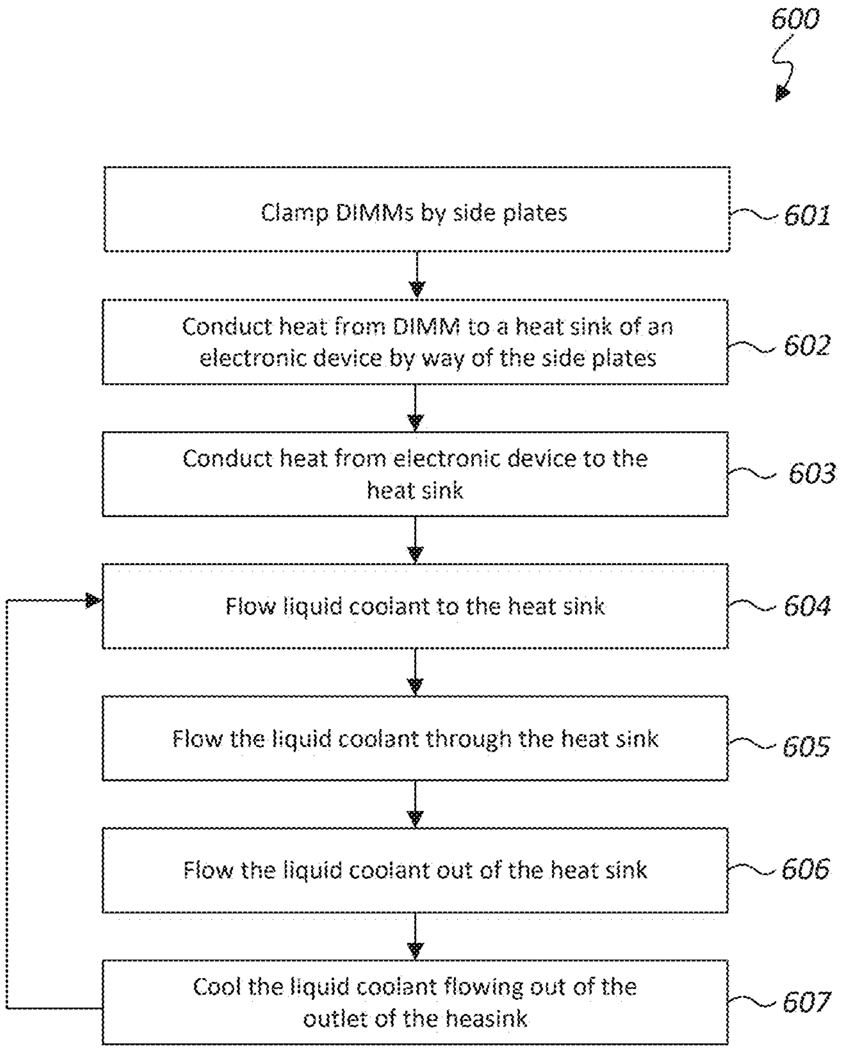
FIG. 8 shows a method of cooling DIMMs, in accordance with an embodiment of the present invention.

FIG. 8 shows a method 600 of cooling DIMMs, in accordance with an embodiment of the present invention. The method 600 is explained using previously-disclosed components. As can be appreciated, other components may also be employed without detracting from the merits of the present invention.

In step 601, each DIMM of a plurality of DMMs is clamped by a pair of side plates.

In step 602, heat is conducted from a DIMM to a heat sink of an electronic device by way of the side plates. The electronic device may be a CPU or other IC, for example. The heat sink of the electronic device may comprise a cold plate, a base plate that is attached to the cold plate, and a transfer plate that is attached to the side plates and to the cold plate. The side plates that clamp the DIMMs may be attached to the transfer plate by way of a thermal interface material.

In step 603, heat is conducted from the electronic device to the heat sink of the electronic device.

In step 604, a liquid coolant is flowed into the heat sink of the electronic device. For example, the liquid coolant may be pumped (i.e., using a pump) to an inlet of the cold plate.

In step 605, the liquid coolant is flowed through the heat sink of the electronic device, such as by pumping the liquid coolant through the cold plate.

In step 606, the liquid coolant is flowed out of the heat sink of the electronic device. For example, the liquid coolant may be pumped out of the cold plate through an outlet port of the cold plate.

In step 607, the liquid coolant flowing out of the heat sink of the electronic device is cooled. For example, the liquid coolant may be circulated through the cold plate using a pump. A radiator or other heat exchanger between the pump and the cold plate may be used to cool warm liquid coolant flowing out of the cold plate through the outlet port.

A heat sink assembly for DIMMs is disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A heat sink assembly comprising:

a plurality of side plates that supports a plurality of dual in-line memory modules (DIMMs), each of the plurality of DIMMs is clamped by a pair of side plates of the plurality of side plates;

a cold plate comprising an inlet port and an outlet port that are connected to flow a liquid coolant through the cold plate, wherein the cold plate is attached to an electronic device; and a transfer plate that is fastened to the cold plate and attached to the plurality of side plates to conduct heat from the plurality of DIMMs to the cold plate, wherein the transfer plate is attached to top surfaces of the plurality of side plates, and a first thermal pad is disposed between the top surfaces of the plurality of side plates and the transfer plate.

2. The heat sink assembly of claim 1, further comprising second thermal pad that is disposed between each side plate of the plurality of side plates and a corresponding DIMM of the plurality of DIMMs.

3. The heat sink assembly of claim 1, further comprising:

a base plate, wherein the cold plate is attached to the electronic device by way of the base plate.

4. The heat sink assembly of claim 1, wherein the plurality of side plates are identical and interchangeable.

5. The heat sink assembly of claim 4, wherein the plurality of side plates is die-casted using a same mold.

6. The heat sink assembly of claim 1, wherein the electronic device is a central processing unit (CPU).

7. The heat sink assembly of claim 1, further comprising a fastener that goes through holes of the plurality of side plates.

8. The heat sink assembly of claim 7, wherein the fastener comprises a long bolt that goes through the holes and is secured by a nut.

9. The heat sink assembly of claim 1, wherein each side plate of the plurality of side plates has a first bar portion on a front end and a second bar portion on a back end that prevent a DIMM clamped by the side plate from moving laterally.

10. The heat sink assembly of claim 1, wherein connectors of the plurality of DIMMs extend past bottom ends of the plurality of side plates.

11. A method of dissipating heat from a plurality of dual in-line memory modules (DIMMs), the method comprising:

clamping each of the plurality of DIMMs by a pair of side plates of a plurality of side plates;

conducting heat from the plurality of DIMMs to a heat sink of an electronic device by way of the plurality of side plates, wherein the heat sink comprises a cold plate and a transfer plate that is fastened to the cold plate and attached to the plurality of side plates, wherein the transfer plate is attached to top surfaces of the plurality of side plates, and a first thermal pad is disposed between the top surfaces of the plurality of side plates and the transfer plate;

conducting heat from the electronic device to the heat sink;

flowing a liquid coolant through the heat sink; and cooling the liquid coolant.

12. The method of claim 11, wherein clamping each of the plurality of DIMMs by a pair of side plates of the plurality of side plates includes placing a second thermal pad between each of the plurality of DIMMs and a corresponding side plate of the plurality of side plates.

13. The method of claim 11, wherein the electronic device is a central processing unit (CPU).

14. The method of claim 11, wherein flowing the liquid coolant through the heat sink includes pumping, using a pump, the liquid coolant through the cold plate by way of an inlet port and an outlet port of the cold plate.

15. The method of claim 14, wherein the liquid coolant is cooled using a heat exchanger that is disposed between the pump and the cold plate.

* * * * *